(12) United States Patent
Obata et al.

(10) Patent No.: US 6,777,108 B1
(45) Date of Patent: Aug. 17, 2004

(54) ELECTROLYTIC COPPER FOIL WITH CARRIER FOIL AND METHOD FOR MANUFACTURING THE SAME AND COPPER-CLAD LAMINATE USING THE ELECTROLYTIC COPPER FOIL WITH CARRIER FOIL

(75) Inventors: Shin-ichi Obata, Ageo (JP); Makoto Dobashi, Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 354 days.

(21) Appl. No.: 09/856,350

(22) PCT Filed: Aug. 10, 2000

(86) PCT No.: PCT/JP00/05362

§ 371 (c)(1),
(2), (4) Date: May 18, 2001

(87) PCT Pub. No.: WO01/21859

PCT Pub. Date: Mar. 29, 2001

(30) Foreign Application Priority Data

Sep. 21, 1999 (JP) ............................................. 11-267652

(51) Int. Cl.[7] ......................... B32B 15/04; B32B 15/08; B32B 15/20; C25D 5/00; C25D 5/34
(52) U.S. Cl. ....................... 428/624; 428/626; 428/607; 428/606; 428/675; 428/674; 428/43; 428/336; 428/457; 205/182; 205/210; 205/215; 205/220; 205/239
(58) Field of Search ................................. 428/606, 607, 428/626, 624, 615, 674, 675, 671, 686, 687, 41.8, 43, 457, 699, 901, 935, 336; 205/170, 182, 210, 215, 220, 239, 243, 317, 319, 291, 269, 271, 300, 245, 246

(56) References Cited

U.S. PATENT DOCUMENTS

| 4,088,544 A | * | 5/1978 | Hutkin ......................... 204/12 |
| 5,858,517 A | * | 1/1999 | Tagusari et al. ............ 428/209 |
| 6,270,648 B1 | * | 8/2001 | Yates et al. .................. 205/138 |
| 6,270,889 B1 | * | 8/2001 | Kataoka et al. ............. 428/352 |
| 6,319,620 B1 | * | 11/2001 | Kataoka et al. ............. 428/626 |
| 6,346,335 B1 | * | 2/2002 | Chen et al. .................. 428/629 |

FOREIGN PATENT DOCUMENTS

| JP | 63-274795 A | 11/1988 |
| JP | 02-113591 A | 4/1990 |
| JP | 05-102630 A | 4/1993 |

* cited by examiner

Primary Examiner—Michael LaVilla
(74) Attorney, Agent, or Firm—Jenkens & Gilchrist

(57) ABSTRACT

To control peel strength at an organic release interface between a carrier foil and a copper-microparticle layer which constitute an electrodeposited copper foil with carrier. In the present invention, (1) a barrier copper layer is formed on the release interface layer and copper microparticles are formed on the barrier layer; (2) the anti-corrosion treatment is carried out by use of a plating bath containing a single metallic component or a plurality of metallic components for forming an alloy, the plating bath(s) having a deposition potential less negative than −900 mV (vs. AgCl/Ag reference electrode); and (3) methods (1) and (2) are combined.

9 Claims, 3 Drawing Sheets

ELECTROLYTIC COPPER FOIL WITH CARRIER FOIL AND METHOD FOR MANUFACTURING THE SAME AND COPPER-CLAD LAMINATE USING THE ELECTROLYTIC COPPER FOIL WITH CARRIER FOIL

TECHNICAL FIELD

The present invention relates to electrodeposited copper foil with carrier; to a method for producing the electrodeposited copper foil; and to a copper-clad laminate formed by use of the electrodeposited copper foil with carrier.

BACKGROUND ART

Conventionally, peelable-type electrodeposited copper foils with carrier have been widely employed for producing copper-clad laminates, by laminating the copper foil with a substrate through hot pressing and then peeling off the carrier attached to the electrodeposited copper foil. The peel strength at the release interface between the carrier and the copper foil varies over a wide range. Some electrodeposited copper foils with carriers exhibit easy peeling during handling thereof, and others exhibit failure to peel after hot pressing is carried out.

In order to solve the aforementioned problems, the present inventors have proposed electrodeposited copper foils with carrier in which the release interface between a carrier and a copper foil is formed from an organic agent. A main advantage of the copper foils with carriers is moderate and stable peeling strength at the release interface. The technical idea relating to such electrodeposited copper foils with carrier will enable production of new types of foils which have not yet been developed.

One example is an electrodeposited copper foil with carrier produced by forming an organic release interface on the carrier, forming copper microparticles on the release interface through electrodeposition; and subjecting the thus-coated foil to anti-corrosion treatment. The electrodeposited copper foil with carrier is used for producing printed wiring boards in the following manner.

Firstly, a substrate (prepreg) is laminated onto the electrodeposited copper layer formed of copper microparticles, followed by hot-pressing, to thereby prepare a copper-clad laminate. Thereafter, the carrier is removed from the copper clad laminate.

Subsequently, a bulk copper layer which serves as a conductor of a printed wiring board is formed on the copper-microparticle layer to an arbitrary thickness through copper plating followed by a step; e.g., any etching step, thereby producing a typical printed wiring board as a final product. This sequence would be considerably effective for producing wiring boards that satisfy the demand for more finely patterned wiring boards.

However, when the electrodeposited copper foil layer contained in an electrodeposited copper foil with carrier is formed exclusively from copper microparticles and a release interface is formed from an organic agent, conditions for producing the copper foil with carrier must be carefully controlled. Thus, unless the conditions are appropriate, moderate and stable peel strength is not attained.

In practice, the organic release interface layer formed is damaged during formation of a copper-microparticle layer and during anti-corrosion surface treatment, thereby affecting peeling strength at the interface. This phenomenon has been investigated thoroughly, and the inventors have found that when the amount of an organic material forming the release interface layer decreases, the peel strength at the release interface between the carrier foil layer and the copper-microparticle layer increases thereby worsening peelability.

SUMMARY OF THE INVENTION

In view of the foregoing, the present inventors have carried out thorough studies, and have found that a decrease in the amount of an organic material forming the release interface occurs in a step of the surface treatment; i.e., for plating with an anticorrosive element, among the aforementioned production steps.

In other words, the present inventors have developed and accomplished their invention based on the following two points; (1) a copper thin-film layer serving as a barrier against attack by surface treatment bath is provided on an organic release layer and (2) use of a surface treatment bath which imparts no damage to the organic release layer.

In the first aspect, the invention provides an electrodeposited copper foil with carrier in which a carrier foil and an electrodeposited copper foil layer are bonded via an organic release interface layer in a layered manner so that the carrier foil can be readily peeled off during use thereof and an electrodeposited copper foil layer exclusively formed of copper microparticles, the electrodeposited copper foil with carrier comprising a carrier foil; an organic release interface layer formed on the carrier foil; a thin-film copper layer formed on the organic release layer; a copper-microparticle layer formed on the thin-film copper layer; and an anti-corrosion layer formed on the copper-microparticle layer.

Figure 1:
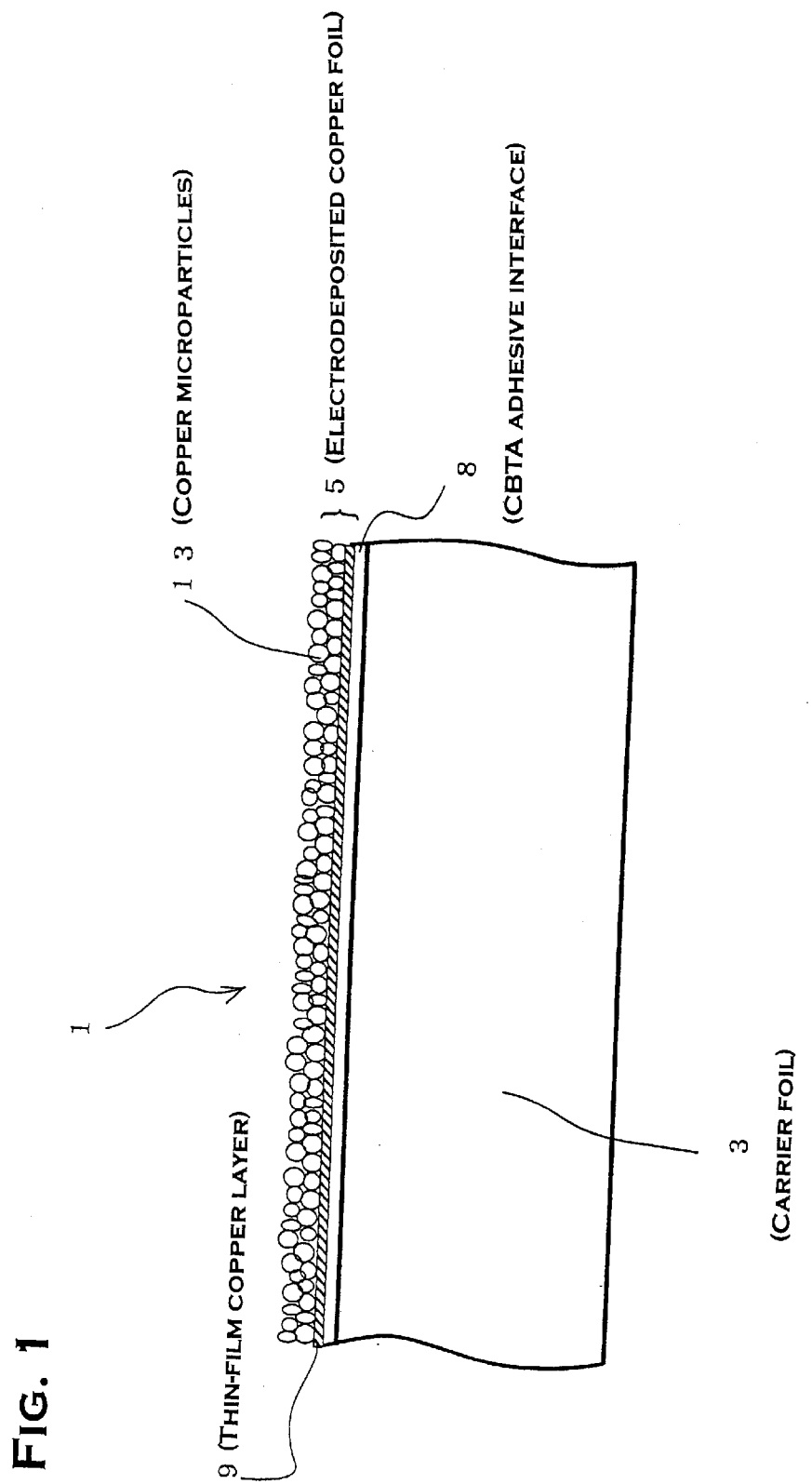
FIG. 1 is a schematic cross-sectional view of one electrodeposited copper foil with carrier according to the present invention.

A thin-film copper layer is provided on an organic release interface layer, and this copper layer serves as a barrier against attack by a bath employed in one of the surface treatment steps described below. FIG. 1 is a schematic cross-sectional view of the electrodeposited copper foil with carrier according to claim 1. In the electrodeposited copper foil with carrier, the barrier layer functions as a barrier against a bath employed in a surface treatment step and prevents direct contact between the solution and the organic release interface, thereby mitigating damage to the interface.

The thin-film copper layer serving as a barrier layer may have an arbitrary thickness, so long as the copper layer prevents contact between the release interface and a bath employed in a surface treatment step. However, the thin-film layer does not require an unnecessarily large thickness. In cases in which the thin-film copper layer has a thickness of 3 μm or more, the layer is substantially a customarily employed bulk ultra-thin copper foil, and such a layer may or may not be called a "barrier layer." Another function of the barrier layer is to provide deposition sites dedicated for copper microparticles which are to be electrodeposited on the barrier surface. Therefore, fine copper particles can be formed with high area density, as compared with copper microparticles electrodeposited directly on the organic release layer.

The thin-film copper layer serving as a barrier layer has a thickness of 0.5–1.0 μm. The lower limit, i.e., 0.5 μm, is based on the limit for analyzing film thickness. Thus, it is considered that film having a thickness less than 0.5 μm may be employed without any problems so long as the film is of uniform thickness. The film may have a thickness in excess of the upper limit, but in this case, the surface shape of the copper-microparticle layer as observed after removal of a carrier foil from the laminate differs from that of the copper-microparticle layer of a laminate that does not employ a copper thin film. Thus, one of the advantages in use of the electrodeposited copper foil with carrier according to the present invention is not attained. In addition, when the barrier layer has a thickness of 3 μm or more, the layer is substantially a customarily-employed bulk ultra-thin copper foil.

One method for producing an electrodeposited copper foil with carrier may comprise cleaning a carrier foil through pickling; forming a release interface layer on the cleaned surface by use of an organic agent; forming a thin-film copper layer on the release interface layer through electrodeposition; forming a copper-microparticle layer on the thin-film copper layer through electrodeposition; and forming a anti-corrosion layer on the copper-microparticle layer.

No particular limitation is imposed on the material of the carrier, and customarily-employed metal foil such as aluminum foil or copper foil or conductive organic film may be used in accordance with the purpose for use thereof. The organic release interface layer is suitably formed by use of an organic agent described below. The carrier foil itself must be electrically conductive, since the carrier is cathodically polarized in a plating bath so as to facilitate electrodeposition of copper microparticles thereon.

Pickling of a carrier foil is carried out by use of an acid such as dilute sulfuric acid or dilute hydrochloric acid so as to remove unfavorable oxide film. Thus, pickling is a pretreatment step to facilitate subsequent formation of an organic release interface layer or a thin-film copper layer without any problem.

The organic agent which is employed to form the organic release interface is carboxybenzotriazole (hereinafter this compound may be referred to as CBTA). Among a variety of organic compounds, carboxybenzotriazole is employed to attain smooth peeling of a carrier from the electrodeposited copper foil at the organic release interface with the carrier according to the present invention.

Next will be described the methods for forming a release interface layer on a carrier foil by use of the aforementioned carboxybenzotriazole. Specifically, the release interface layer may be produced by dissolving the aforementioned carboxybenzotriazole in a solvent, and immersing a carrier foil in the solution or applying the solution to a surface on which a release layer is to be formed, through methods such as showering, spraying, dropping, and electrodeposition. The method for forming the interface layer is not particularly limited. The concentration of carboxybenzotriazole is preferably 0.01 g/l to 10 g/l, and the solution temperature is preferably 20–60° C. The concentration of carboxybenzotriazole is not particularly limited, and a solution of high or low concentration can be employed without raising any particular problem. The aforementioned method for applying carboxybenzotriazole may be repeated, whereby the thickness of the release interface layer is regulated with higher precision.

In general, the higher the concentration of CBTA, the higher the rate of adsorption of CBTA to the carrier foil. Principally, the concentration of CBTA is determined in accordance with the speed of the production line. The time for contact between the carrier foil and the solution containing CBTA is also determined by the speed of the production line, and in practice is generally 5–60 seconds.

In consideration of the aforementioned conditions, when the concentration is below the lower limit; i.e., 0.01 g/l, complete adsorption of CBTA within a short time is difficult to attain and the thickness of the formed release interface layer varies, resulting in failure to maintain the quality of the final product. When the concentration is in excess of the upper limit; i.e., 10 g/l, the adsorption rate does not increase commensurately with the amount of added CBTA. Such an excessive concentration is disadvantageous from the viewpoint of production costs.

When the aforementioned carboxybenzotriazole is used, the amount thereof for forming an organic release interface layer is readily carried out and peel strength between a carrier foil and an electrodeposited copper foil can be adjusted to within a suitable range. In addition, the formed release interface layer has excellent thermal stability and an appropriate peel strength can be assured after hot pressing.

After a carrier foil is peeled off an electrodeposited copper foil, carboxybenzotriazole is transferred to the electrodeposited copper foil to remain as an organic film serving as an anti-corrosion layer of the copper foil. The organic film can readily be removed by washing with an acidic solution such as diluted sulfuric acid or diluted hydrochloric acid, and does not affect the production steps of printed wiring boards.

From another important point of view, at present, the aforementioned carboxybenzotriazole has been proven to have no adverse effect on the production steps of printed wiring boards, such as a variety of resist application steps, etching steps, plating steps, and mounting steps, which are carried out after production of a copper-clad laminate.

Carboxybenzotriazole, which itself is an organic compound, serves as a material having an electric insulating property rather than electric conductivity. As mentioned above, the electrodeposited copper foil with carrier according to claim 1 is produced by cathodically polarizing a carrier foil per se to thereby form an organic release interface layer comprising carboxybenzotriazole on the carrier foil and electrodepositing copper directly on the organic release interface layer. Therefore, the release interface layer must permit conduction of electricity. Thus, the thickness of the organic release interface layer formed of carboxybenzotriazole has a limitation, and must be adjusted to a thickness which ensures suitable peel strength and which attains stable electrodeposition of copper.

In this case, concentration and treatment time of a carboxybenzotriazole solution in forming a release interface layer are relatively unimportant, but the thickness of the thus-formed release interface layer is important. In other words, the amount of carboxybenzotriazole constituting the release interface layer is important. Preferably, the release layer has a thickness of 1 nm to 1 μm.

When the thickness falls within the aforementioned range, appropriate peel strength can be assured and electrodeposition of copper can be performed stably. Specifically, when the amount of carboxybenzotriazole used to form an organic release interface layer (thickness)is lower than the lower limit; i.e., 1 nm, the thickness of the release interface layer varies, and the release layer encounters difficulty in providing a homogeneous organic release interface layer. As a result, appropriate peel strength cannot be attained after press-forming, and in some cases a carrier foil cannot be peeled off.

In contrast, when the thickness is in excess of the upper limit; i.e., 1 μm, electric current flowing in the carrier foil in the course of electrodeposition of copper microparticles on a cathodically polarized carrier foil becomes unstable. Thus, an electrodeposited copper foil layer of uniform thickness is difficult to form.

In the present description, the term "appropriate peel strength" refers to a peel strength, as measured on the basis of JIS C-6481, of 1–100 gf/cm. The range is calculated in consideration of peelable-type electrodeposited copper foils with carrier which have conventionally been used. Specifically, the range has been obtained in view of peel strength which has empirically been considered to be appropriate and ideal peel strength which users desire to attain. The lower the peel strength at an interface between a carrier foil and an electrodeposited copper foil, the easier the peeling of the carrier foil from the copper foil.

However, when the peel strength is less than 1 gf/cm, a carrier foil is spontaneously separated partially from an electrodeposited copper foil during travelling of a roll in the production process of the copper foil with carrier or during production of copper-clad laminates, thereby causing generation of failures such as blisters and slippage. When the peel strength is in excess of 100 gf/cm, a carrier foil is difficult to peel off and peeling the carrier foil off requires a particular peeling apparatus. This situation differs from the features of the present invention.

After the organic release interface layer is formed in the aforementioned manner, a thin-film copper layer is formed. The thin-film copper is formed on the organic release interface layer through electrodeposition. No particular limitation is imposed on the copper ion source employed in a thin-film copper layer-forming bath, and a solution such as copper sulfate solution or copper pyrophosphate solution may be used. For example, a copper sulfate solution comprising copper (30–100 g/l) and free sulfuric acid (50–200 g/l) is employed at a solution temperature of 30–80° C. and a current density of 1–100 A/dm$^2$, and a copper pyrophosphate solution comprising copper (10–50 g/l) and potassium pyrophosphate (100–700 g/l) is employed at a solution temperature of 30–60° C., a pH of 8–12, and a current density of 1–5 A/dm$^2$.

In practice, an organic release interface-formed carrier foil is immersed in a copper plating bath. The carrier foil per se is cathodically polarized, while anodes are placed so as to face a release surface of the carrier foil in parallel. Thus, copper species for forming a thin-film copper layer are homogeneously and smoothly deposited on the organic release interface layer.

After formation of the thin-film copper layer is completed, the carrier foil is treated in a copper-microparticles-forming bath so as to form copper microparticles on the thin-film copper layer. More specifically, the process for forming copper microparticles includes a step of depositing copper microparticles on the thin-film copper layer and a step of seal plating so as to prevent release of deposited copper microparticles.

In a step of depositing copper microparticles on the thin-film copper layer, a solution similar to a solution placed in the aforementioned thin-film-forming bath is used as a source of supplying a copper ion. Thin-film formation is carried out under uniform plating conditions, whereas copper microparticles are deposited under burnt deposition conditions. Typically, a solution employed for depositing copper microparticles on the thin-film copper layer has a concentration lower than that of a solution for forming a thin-film copper layer, so as to facilitate attainment of burnt deposition conditions. No particular limitation is imposed on the burnt deposition conditions, and the conditions are determined in consideration of characteristics of a production line. For example, a copper sulfate solution comprising copper (5–20 g/l), free sulfuric acid (50–200 g/l), and a suitable additive such as α-naphthoquinone, dextrin, glue, or thiourea is employed at a solution temperature of 15–40° C. and a current density of 10–50 A/dm$^2$ Seal plating is a step for uniformly coating copper microparticles with copper under smooth plating conditions so as to prevent release of deposited copper microparticles. Thus, a solution similar to that placed in the aforementioned thin-film-forming bath is used as a source of supplying a copper ion. No particular limitation is imposed on the uniform deposition conditions, and the conditions are determined in consideration of characteristics of a production line. For example, a copper sulfate solution comprising copper (50–80 g/l) and free sulfuric acid (50–150 g/l) is employed at a solution temperature of 40–50° C. and a current density of 10–50 A/dm$^2$.

Next will be described a method for forming an anti-corrosion layer. The layer is formed in a passivation bath, i.e. an anti-corrosion-treatment bath. The anti-corrosion layer prevents oxidation-induced corrosion of a surface of an electrodeposited copper foil layer so as to prevent failures in the course of producing copper-clad laminates and printed wiring boards. Both organic anti-corrosion treatment by use of a compound such as benzotriazole or imidazole and inorganic anti-corrosion treatment by use of a compound such as zinc, chromate, or zinc alloy may be acceptable. These methods may be selected in accordance with the purpose of employment of the electrodeposited copper foil with carrier.

When an organic compound is employed in anti-corrosion, such an organic agent may be applied through immersion, showering, or electrodeposition. When an inorganic compound is employed, a corrosion-inhibiting element may be deposited on an electrodeposited copper foil through electrolysis or substitution deposition. For example, a plating bath such as a zinc pyrophosphate plating bath, a zinc cyanide plating bath, or a zinc sulfate plating bath may be employed for carrying out anti-corrosion treatment with zinc. Specifically, a zinc phosphate plating bath comprising zinc (5–30 g/l) and potassium pyrophosphate (50–500 g/l) is employed at a solution temperature of 20–50° C., a pH of 9–12, and a current density of 0.3–10 A/dm$^2$.

Thus, the electrodeposited copper foil with carrier according to claim 1 is produced through any of the aforementioned methods. The thus-produced electrodeposited copper foil with carrier serves as material for producing printed wiring boards.

In the present specification, the terms "copper-clad laminate" and "printed wiring board" encompass a single-side substrate, a double-side substrate, and a multilayer substrate. Such substrates may be fabricated from a rigid substrate, a hybrid substrate, or a flexible substrate including a particularly designed substrate such as TAB or COB.

In a second aspect, the invention provides an electrodeposited copper foil with carrier in which a carrier foil and an electrodeposited copper foil layer are bonded via an organic release interface layer in a layered manner and the carrier foil can readily be peeled off at use thereof, the electrodeposited copper foil with carrier comprising a carrier foil; an organic release interface layer formed on the carrier foil by use of carboxybenzotriazole; a copper-microparticle layer formed on the organic release interface layer; and an anti-corrosion layer formed on the copper-microparticle layer, the anti-corrosion layer being formed by use of a plating bath containing a single metallic component or a plurality of metallic components for forming an alloy, the plating bath having a deposition potential less negative than −900 mV (vs. AgCl/Ag reference electrode). The electrodeposited copper foil with carrier is produced on the basis of a concept that a surface treatment bath which imparts no damage to the organic release interface layer is used.

The electrodeposited copper foil with carrier is produced without a thin-film copper layer and is produced by use of an anti-corrosion-layer-forming bath which imparts no damage to the organic release interface layer. This concept differs from that of the electrodeposited copper foil with carrier according to the first aspect of the invention.

The electrodeposited copper foil with carrier is produced in a manner similar to that previously described, except that a thin-film copper layer is not formed. Since the electrodeposited copper foil with carrier according to the first aspect of the invention has a thin-film copper layer serving as a barrier layer, no particular limitation is imposed on the solution employed in an anti-corrosion treatment bath. In contrast, in the case of the electrodeposited copper foil with carrier according to the second aspect of the invention, which has no thin-film copper layer serving as a barrier, the solution employed in an anti-corrosion treatment bath must be a plating bath containing a single metallic component or plurality of metallic components for forming an alloy, the plating bath having a deposition potential less negative than −900 mV (vs. AgCl/Ag reference electrode).

In the electrodeposited copper foil with carrier of the second aspect of the invention, there is formed an electrodeposited copper foil layer in which copper microparticles are deposited in a layered manner to form a porous structure. Thus, a conventional anti-corrosion treatment bath permeates the pores and reaches the organic release interface, to thereby possibly elute or decompose carboxybenzotriazole.

A release interface formed on a copper carrier foil by use of carboxybenzotriazole was quantitatively analyzed by means of a TEM with an EPMA (Electron Probe Micro Analyzer), to thereby detect a copper component in the release interface. Thus, in this case, copper may be incorporated in the release interface layer in a certain form.

On the basis of the analysis, the inventors have investigated a variety of anti-corrosion treatment baths, and have found that a specific anti-corrosion treatment bath is employed so as to reduce damage imparted to an organic release interface layer. Furthermore, continuous screening tests have revealed that anti-corrosion treatment baths containing a metallic component having a deposition potential less negative than −900 mV (vs. AgCl/Ag reference electrode) are able to reduce damage imparted to an organic release interface layer.

Figure 2:
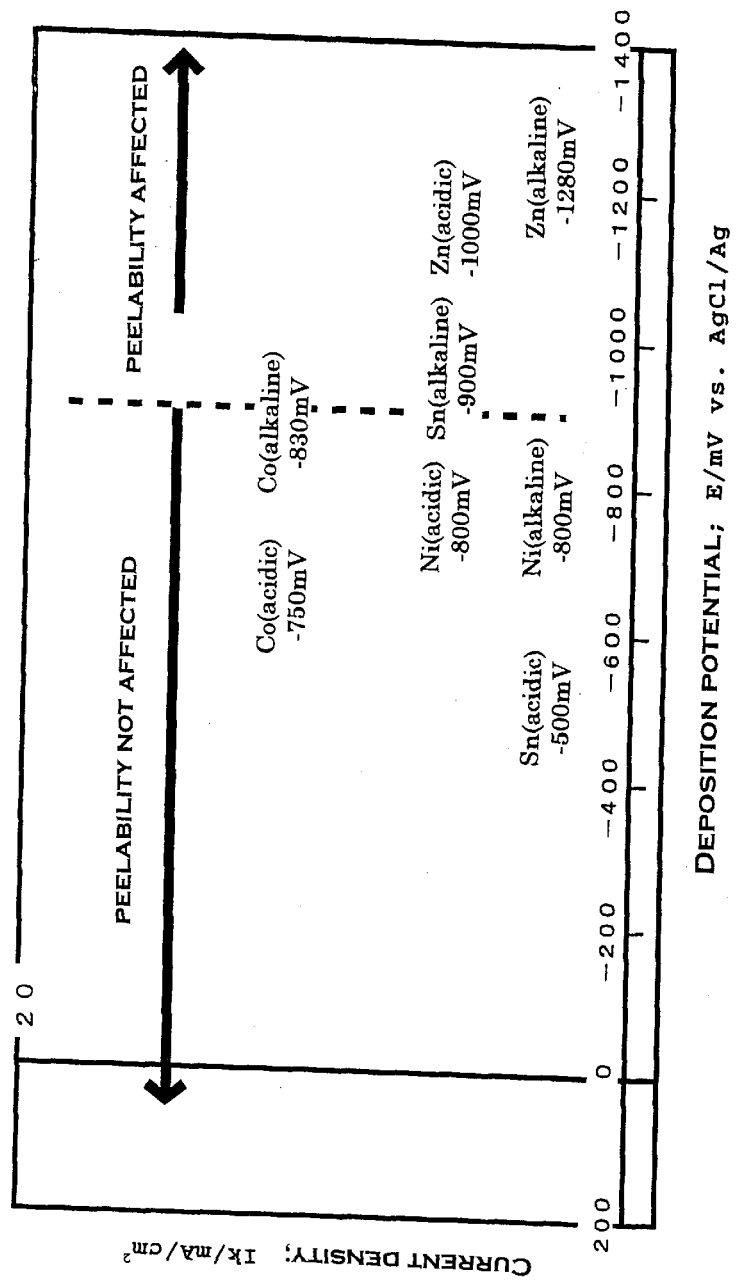
FIG. 2 is a graph showing the relationship between deposition potential and peelability [at an adhesion interface].

The results are shown in FIG. 2. When an anti-corrosion treatment bath contains a metallic component exhibiting a deposition potential falling within a left region from the dashed line representing −900 mV in FIG. 2; i.e., less negative than −900 mV, no elution of carboxybenzotriazole is observed, whereas when a similar solution contains a metallic component exhibiting a deposition potential falling within a right region from the dashed line representing −900 mV; i.e., more negative than −900 mV, elution of carboxybenzotriazole is observed.

Thus, the anti-corrosion treatment bath which can be employed contains an metallic component having a deposition potential less negative than −900 mV (vs. AgCl/Ag reference electrode). However, since the electrodeposited copper foil with carrier is used in printed wiring boards, corrosion-inhibiting elements must be carefully selected in consideration of drawbacks in storage, thermal oxidation during hot-pressing, and etching.

As a result, the following plating baths are preferably employed; i.e., an acidic cobalt plating bath, an alkaline cobalt plating bath, an acidic tin plating-bath, an acidic nickel plating bath, an alkaline nickel plating bath, or a Zn—Ni alloy plating bath containing Ni (40 wt. % or more). These elements and solutions do not affect production steps of printed wiring boards and quality of produced printed wiring boards. In addition, the solutions are considerably stable for serving as a plating bath.

These corrosion-inhibiting elements may be deposited on copper microparticles through any method, such as electrodeposition or substitution deposition. For example, when cobalt is plated under alkaline conditions, a plating bath comprising cobalt (5–30 g/l) and potassium pyrophosphate (50–500 g/l) is employed at a solution temperature of 20–50° C., a pH of 8–11, and a current density of 0.3–10 A/dm$^2$. When cobalt is plated under acidic conditions, a plating bath comprising cobalt (5–30 g/l) and trisodium citrate (50–500 g/l) may be employed at a solution temperature of 20–50° C., a pH of 2–4, and a current density of 0.3–10 A/dm$^2$.

When tin is plated, a plating bath comprising tin (5–30 g/l) may be employed at a solution temperature of 20–50° C., a pH of 2–4, and a current density of 0.3–10 A/dm$^2$.

When nickel is plated under acidic conditions, a plating bath comprising nickel (5–30 g/l) may be employed at a solution temperature of 20–50° C., a pH of 2–4, and a current density of 0.3–10 A/dm$^2$. When nickel is plated under alkaline conditions, a plating bath comprising nickel (5–30 g/l) and potassium pyrophosphate (50–500 g/l) may be employed at a solution temperature of 20–50° C., a pH of 8–11, and a current density of 0.3–10 A/dm$^2$.

When Zn-nickel alloy is plated, a plating bath comprising cobalt (1–2.5 g/l), zinc (0.1–1 g/l), and potassium pyrophosphate (50–500 g/l) may be employed at a solution temperature of 20–50° C., a pH of 8–11, and a current density of 0.3–10 A/dm$^2$.

The invention also is directed to a method for producing an electrodeposited copper foil with carrier, which method comprises cleaning a carrier foil through pickling; forming an organic release interface layer on the carrier by use of carboxybenzotriazole; forming a copper-microparticle layer on the organic release interface layer through electrolysis; and forming an anti-corrosion layer on the copper-microparticle layer by use of a plating bath containing a single metallic component or a plurality of metallic components for forming an alloy, the metallic component(s) having a deposition potential less negative than −900 mV (vs. AgCl/Ag reference electrode).

The invention also provides an electrodeposited copper foil with carrier in which a carrier foil and an electrodeposited copper foil layer are bonded via an organic release interface layer in a layered manner and the carrier foil can readily be peeled off upon use thereof, the electrodeposited copper foil with carrier comprising a carrier foil; an organic release interface layer formed on the carrier foil by use of carboxybenzotriazole; a thin-film copper layer formed on the organic release interface layer; a copper-microparticle layer formed on the thin-film copper layer and an anti-corrosion layer formed on the copper-microparticle layer, the anti-corrosion layer being formed by use of a plating bath containing a single metallic component or metallic components for forming an alloy and the plating bath(s) having a deposition potential less negative than −900 mV (vs. AgCl/Ag reference electrode).

The electrodeposited copper foil with carrier just described has characteristics of the electrodeposited copper foils with carrier according to both the first and second aspects of the invention. Accordingly, the electrodeposited copper foil with carrier has the aforementioned thin-film copper layer and an anti-corrosion layer formed by use of a plating bath containing a single metallic component or a plurality of metallic components for forming an alloy, the plating bath(s) having a deposition potential less negative than −900 mV (vs. AgCl/Ag reference electrode).

Thus, effects of the present invention are more favorably attained by the electrodeposited copper foil with carrier in which a thin-film copper foil and the aforementioned anti-corrosion layer are provided synergistically. The electrodeposited copper foil with carrier may be produced through a method combining the methods for producing electrodeposited copper foils with carrier of the first and second aspects of the invention. Specifically, there are produced a thin-film copper layer of the first aspect of the invention, and an anti-corrosion layer formed by use of a plating bath containing a single metallic component or a plurality of metallic components for forming an alloy, the plating bath(s) having a deposition potential less negative than −900 mV (vs. AgCl/Ag reference electrode) of the second aspect of the invention. For the sake of simplicity, repeated portions of description are omitted.

The invention also is directed to a method for producing an electrodeposited copper foil with carrier, which method comprises cleaning a carrier foil through pickling;

forming an organic release interface layer on the carrier by use of carboxybenzotriazole; forming a thin-film layer copper on the organic release interface layer; forming a copper-microparticle layer on the thin-film copper layer through electrolysis; and forming an anti-corrosion layer on the copper-microparticle layer by use of a plating bath containing a single metallic component or a plurality of metallic components for forming an alloy, the plating bath(s) having a deposition potential less negative than −900 mV (vs. AgCl/Ag reference electrode). The method has characteristics of the methods for producing electrodeposited copper foils with carrier previously described.

The invention further is directed to a single- or double-sided copper-clad laminate formed by use of the electrodeposited copper foil with carrier previously described, which laminate is obtained through laminating the electrodeposited copper foil with carrier on a single-layer or multilayered prepreg such that at least one outer surface layer of the prepreg is in contact with the electrodeposited copper foil face; forming into a panel through hot-pressing; peeling off a carrier foil serving as an outer surface from the copper foil; and forming through electrolysis or electroless plating a bulk copper layer to serve as a conductive portion of formed circuits on a copper-microparticle layer to serve as an outer layer.

The single-or double-sided copper-clad laminate formed by use of the electrodeposited copper foil with carrier is produced through a conventional process for producing single- or double-sided copper-clad laminate. Specifically, a laminate is formed into a panel, and a carrier foil is peeled off, to develop a copper-microparticle layer. Since the thus-developed copper-microparticle layer serves as an outer layer, a bulk copper layer to serve as a conductive portion of fabricated printed circuit boards is required to be formed on the outer layer.

The bulk copper layer is formed through electrolysis or electroless plating. No particular limitation is imposed on the mode for electrolysis or electroless plating, so long as copper is electrodeposited or deposited to even thickness. The thickness of the bulk copper layer may be arbitrarily selected in accordance with purpose in use of fabricated printed wiring boards in consideration of requirements such as the level of pitch of circuit patterns.

The invention also is directed to a multilayer copper-clad laminate formed by use of the electrodeposited copper foils with carriers as previously discussed, which laminate is obtained through laminating the electrodeposited copper foil with carrier on at least one outermost surface layer of a core material in which an internal circuit is provided via a prepreg such that the electrodeposited copper foils oppositely face one another; forming into a panel through hot-pressing; peeling off a carrier foil serving as an outer surface from the copper foil; and forming through electrolysis or electroless plating a bulk copper layer to serve as a conductive portion of formed circuits on a copper-microparticle layer to serve as an outer layer.

The term "multilayer copper-clad laminate" refers to a copper-clad laminate having at least three conductor layers other than a single-or double-sided copper-clad laminate.

Thus, the multilayer copper-clad laminate also encompasses a quadruple laminate, which is called a "shield panel" in the art.

The term "core material" is fabricated from a copper-clad laminate by etching to form a circuit or a shield layer. The core material constitutes an inner layer in a produced multilayer copper-clad laminate. The core material may be used singly or in combination of two or more layers. In general, a plurality of core material sheets are employed in a multilayer copper-clad laminate called a "6-layer laminate."

The present invention will next be described with reference to embodiments.

EXAMPLES

Figure 3:
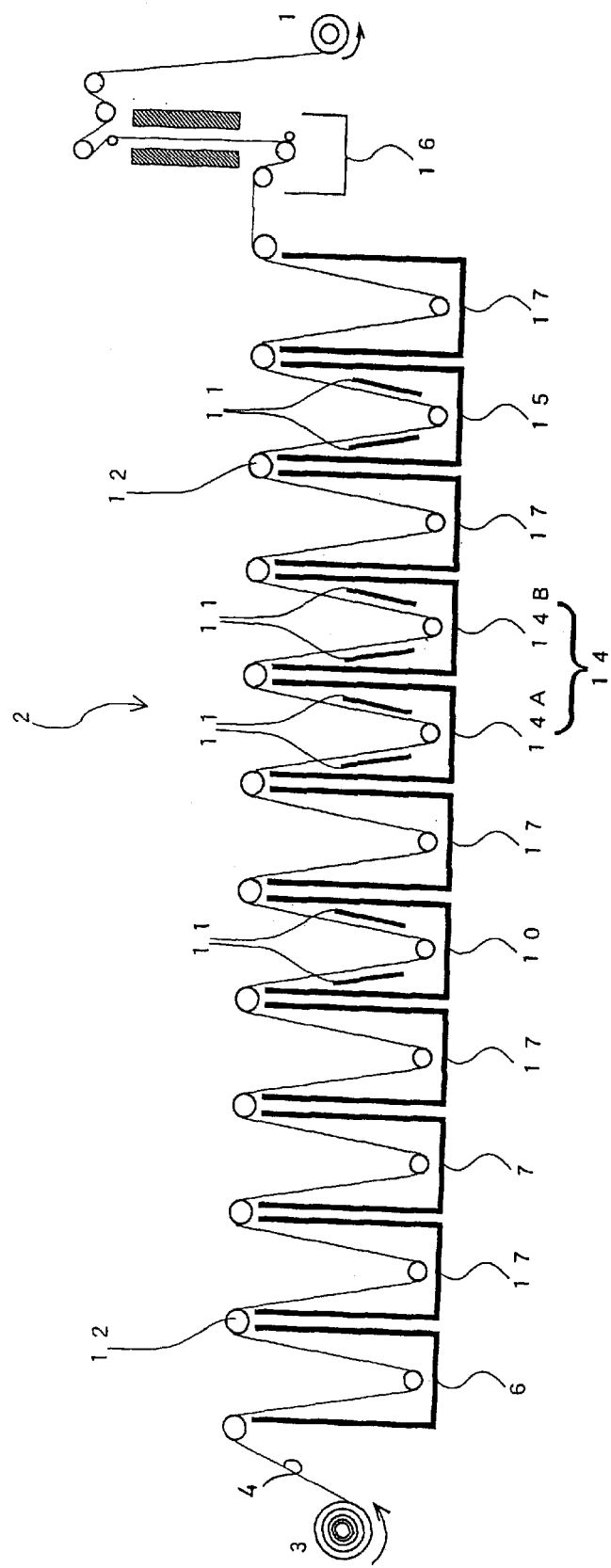
FIG. 3 is a schematic cross-sectional view of an apparatus used for producing an electrodeposited copper foil with carrier.

Embodiments of the present invention will next be described. In the following examples, methods for producing the electrodeposited copper foil with carrier of the present invention and copper-clad laminates produced from the electrodeposited copper foil with carrier are described, along with results of evaluation of peeling strength at an organic release interface. The embodiments are described with reference to FIG. 1, and the carrier foil described in the following examples is formed of an electrodeposited copper foil. Herein, possible best modes for carrying out the invention will be described. An apparatus 2 for producing an electrodeposited copper foil with carrier 1 is shown in FIG. 3. In the apparatus, a carrier foil 3 is unwound from a foil roll and travels, in a winding manner, along the process line. A drum foil having a thickness of 18 μm and classified as grade 3 was employed as the carrier foil 3, and the electrodeposited copper foil layer 5 having a thickness of 3 μm was formed on a shiny side 4 of the carrier foil. Hereinafter, production conditions of electrodeposited copper foils with carrier will be described with reference to an apparatus wherein a variety of baths are continuously disposed in-line.

Firstly, the carrier foil 3 taken from the foil roll was transferred into a pickling bath 6 filled with a diluted sulfuric acid solution having a concentration of 150 g/l at 30° C. The carrier foil was immersed for 30 seconds, to remove oily matter and oxide film from the surface of the carrier foil 3.

After the carrier foil 3 had been treated in the pickling bath 6, the foil was transferred into an release-interface-forming bath 7 filled with a 5 g/l aqueous solution of CBTA (pH 5) at 40° C. The carrier foil 3 was run into the bath and immersed for 30 seconds, forming on a surface of the carrier foil 3 a CBTA release interface layer 8.

After the CBTA release interface layer 8 had been formed, a thin-film copper layer 9 was formed on the release interface layer. A thin-film-copper-layer-forming bath 10 was filled with a copper sulfate solution having a free sulfuric acid concentration of 150 g/l and a copper concentration of 65 g/l at 45° C. While the carrier foil 3 having a CBTA release interface layer 8 passes through the bath, a thin-film copper layer 9 having a thickness of 0.8 μm is formed. In order to deposit copper evenly and smoothly on the release interface layer, as shown in FIG. 8, anode plates 11 were placed such that the anode plates faced in parallel one surface of the carrier foil 3. Electrolysis was carried out for 60 seconds under smooth plating conditions and at a current density of 5 A/dm$^2$. In this case, at least one tension roll 12 maintaining contact with the running carrier foil 3 served as a current-supplier so as to polarize the carrier foil 3 per se to a cathode.

After formation of the thin-film copper layer 9 is completed, the carrier foil 3 was transferred into a copper-microparticle-forming bath 14 in order to form copper microparticles 13 on the surface of the thin-film copper layer 9. The treatment carried out in the copper-microparticle-forming bath 14 involves depositing copper microparticles 13 on the bulk copper layer 9 (step 14A) and seal-plating so as to prevent release of the copper microparticles 13 (step 14B).

Step 14A, depositing copper microparticles 13 on the thin-film copper layer 9 employed a copper sulfate solution (free sulfuric acid concentration of 100 g/l, copper concentration of 18 g/l, temperature 30° C.) similar to that employed in the thin-film-copper-layer-forming bath 10, and electrolysis was carried out for seven seconds under conditions for forming burnt deposit at a current density of 15 A/dm$^2$. In this case, as shown in FIG. 3, anode plates 11 were placed such that the anodes plates faced the thin-film-copper-layer-deposited surface of the carrier foil 3 in parallel.

Step 14B, seal-plating so as to prevent release of the copper microparticles 13, employed a copper sulfate solution (free sulfuric acid concentration of 150 g/l, copper concentration of 65 g/l, temperature 40° C.) similar to that employed in the thin-film-copper-layer-forming bath 10, and electrolysis was carried out for 30 seconds under seal plating conditions and at a current density of 5 A/dm$^2$. In this case, as shown in FIG. 3, anode plates 11 were placed such that the anodes plates faced the copper-microparticles (13)-deposited surface of the carrier foil 3 in parallel.

Passivation, i.e. anti-corrosion treatment was carried out in an anti-corrosion-treatment bath 15, by use of zinc and nickel as corrosion-inhibiting elements, which have a deposition potential less negative than −900 mV. The concentrations of zinc and nickel in the anti-corrosion-treatment bath 15 was maintained. The electrolysis was carried out in a plating bath comprising zinc (0.95 g/l), nickel (1.45 g/l), and potassium pyrophosphate (100 g/l), at a temperature of 40° C. for five seconds and a current density of 0.4 A/dm$^2$.

After completion of the anti-corrosion treatment, the carrier foil 3 was passed through, over 40 seconds, a drying portion 16 where the atmosphere had been heated to 110° C., to thereby finish an electrodeposited copper foil with carrier 1, which was then wound into a roll. During the aforementioned steps, the carrier foil ran at 2.0 m/minute. The foil was then rinsed with water in a rinsing bath 17 capable of performing about 15 sec. rinsing and disposed between successive operation baths, thereby preventing the solution from being carried over from the previous bath.

The thus-formed electrodeposited copper foil with carrier 1 and two sheets of FR-4 prepreg having a thickness of 150 μm were laminated to thereby produce a double-sided copper-clad laminate. The peel strength at the organic release interface 8 between the carrier foil layer 3 and the electrodeposited copper foil layer 5 was measured. The measured peel strength was 5 gf/cm (PS1, before heating) and 5 gf/cm (PS2, after one hour heating at 180° C.). The present inventors further produced 10 lots of the products under the conditions employed above and measured peel strength in a similar manner. The results show that average peel strength of the lots is 5.12 gf/cm with an interlot standard deviation of 0.031 (PS1), and 5.14 gf/cm with an interlot standard deviation of 0.033 (PS2). Thus, considerably stable peel performance are obtained.

Furthermore, after the carrier foils 3 were peeled, a bulk copper layer having a thickness of approximately 3 μm was formed on both sides of laminate through electrolysis by use of a bath employed for forming the thin-film copper layer 9 for 60 second under smooth plating conditions at a current density of 25 A/dm$^2$. When formation of 40 μm-pitch microcircuits was carried out, a remarkably fine pattern could be formed in the thus-formed bulk copper layer.

EFFECTS OF THE INVENTION

The electrodeposited copper foil with carrier according to the present invention enables stable peeling at an interface between a carrier foil layer and an electrodeposited copper-microparticle layer with a small peeling force. The electrodeposited copper foil with carrier can be employed for producing copper-clad laminate and can be adapted to steps for manufacturing printed wiring boards, even though the copper foil layer exclusively comprises copper microparticles. In an etching step, a bulk copper layer of arbitrary thickness can be formed on copper microparticles in accordance with production line characteristics. Thus, the electrodeposited copper foil with carrier according to the present invention enables production of printed wiring boards having finer pitch.

What is claimed is:

1. An electrodeposited copper foil with carrier in which a carrier foil and an electrodeposited copper foil layer are bonded via an organic release interface layer in a layered manner so that the carrier foil can be readily peeled off during use thereof, the electrodeposited copper foil with carrier comprising a carrier foil; an organic release interface layer formed on the carrier foil; a 0.5–1.0 μm thin-film copper layer formed on the organic release layer, a copper-microparticle layer formed on the thin-film copper layer, and an anti-corrosion layer formed on the copper-microparticle layer.

2. An electrodeposited copper foil with carrier in which a carrier foil and an electrodeposited copper foil layer are bonded via an organic release interface layer in a layered manner and the carrier foil can readily be peeled off at use thereof, the electrodeposited copper foil with carrier comprising a carrier foil; an organic release interface layer formed on the carrier foil by use of carboxybenzotriazole, a copper-microparticle copper foil layer formed directly on the organic release interface layer, and an anti-corrosion layer formed on the copper-microparticle layer, wherein the anti-corrosion layer is formed by use of a plating bath containing a single metallic component or a plurality of metallic components for forming an alloy, the plating bath having a deposition potential less negative than −900 mV (vs. AgCl/Ag reference electrode), and wherein said plating bath in parts no damage to the organic release interface layer.

3. An electrodeposited copper foil with carrier in which a carrier foil and an electrodeposited copper foil layer are bonded via an organic release interface layer in a layered manner and the carrier foil can readily be peeled off upon use thereof, the electrodeposited copper foil with carrier comprising a carrier foil; an organic release interface layer formed on the carrier foil by use of carboxybenzotriazole, a 0.5–1.0 μm thin-film copper layer formed on the organic release interface layer, a copper-microparticle layer formed on the thin-film copper layer and an anti-corrosion layer formed on the copper-microparticle layer, wherein the anti-corrosion layer is formed by use of a plating bath containing a single metallic component or metallic components for forming an alloy and the plating bath having a deposition potential less negative than −900 mV (vs. AgCl/Ag reference electrode).

4. An electrodeposited copper foil with carrier according to any one of claims 2 and 3, wherein the plating bath containing a single metallic component or metallic components for forming an alloy and the plating bath having a deposition potential less negative than −900 mV (vs. AgCl/Ag reference electrode) is any one of an acidic cobalt plating bath, an alkaline cobalt plating bath, an acidic tin plating bath, an acidic nickel plating bath, an alkaline nickel plating bath, or a Zn—Ni alloy plating bath containing Ni (40 wt. % or more of the Zn—Ni).

5. A method for producing an electrodeposited copper foil with carrier as recited in claim 1, comprising cleaning a carrier foil through pickling; forming a release interface layer on the cleaned surface by use of an organic agent; forming a 0.5–1.0 μm thin-film copper layer on the release interface layer through electrodeposition; forming a copper-microparticle layer on the thin-film copper layer through electrodeposition; and forming an anti-corrosion layer on the copper-microparticle layer.

6. A method for producing an electrodeposited copper foil with carrier as recited in claim 2, which method comprises cleaning a carrier foil through pickling; forming an organic release interface layer on the carrier by use of carboxybenzotriazole; forming a copper-microparticle layer on the organic release interface layer through electrolysis; and forming an anti-corrosion layer on the copper-microparticle layer by use of a plating bath containing a single metallic component or a plurality of metallic components for forming an alloy, the plating bath having a deposition potential less negative than −900 mV (vs. AgCl/Ag reference electrode).

7. A method for producing an electrodeposited copper foil with carrier as recited in claim 3, which method comprises cleaning a carrier foil through pickling; forming an organic release interface layer on the carrier by use of carboxybenzotriazole; forming a 0.5–1.0 μm thin-film layer on the organic release interface layer; forming a copper-microparticle layer on the thin-film copper layer through electrolysis; and forming an anti-corrosion layer on the copper-microparticle layer by use of a plating bath containing a single metallic component or a plurality of metallic components for forming an alloy, the plating bath having a deposition potential less negative than −900 mV (vs. AgCl/Ag reference electrode).

8. A single- or double-sided copper-clad laminate formed by use of the electrodeposited copper foil with carrier as recited in any one of claims 1 to 3, which laminate is obtained by a process consisting of laminating the electrodeposited copper foil with carrier of any one of claims 1 to 3 on a single-layer or multi-layered prepreg such that at least one outer surface of the prepreg is in contact with the anticorrosion layer formed on the copper microparticle layer; forming into a panel through hot-pressing; and peeling off said at least one carrier foil from its electrodeposited copper foil.

9. A multilayer copper-clad laminate formed by use of the electrodeposited copper foil with carrier as recited in any one of claims 1 to 3, which laminate is obtained by a process consisting of laminating via a prepreg the electrodeposited copper foil with carrier of any one of claims 1 to 3 on at least one outer surface of a core material in which an internal circuit is provided such that at least one outer surface of the prepreg is in contact with the anticorrosion layer formed on the copper microparticle layer; forming into a panel through hot-pressing; and peeling off said at least one carrier foil from its electrodeposited copper foil.

* * * * *